United States Patent [19]
(12) United States Patent
Cho et al.

(10) Patent No.: US 10,032,780 B2
(45) Date of Patent: Jul. 24, 2018

(54) SEMICONDUCTOR DEVICE INCLUDING DUMMY METAL

(71) Applicant: Samsung Electronics Co., Ltd., Suwon-si (KR)

(72) Inventors: Min Hee Cho, Suwon-si (KR); Satoru Yamada, Yongin-si (KR); Sung-Sam Lee, Yongin-si (KR); Jung-Bun Lee, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 23 days.

(21) Appl. No.: 15/139,444

(22) Filed: Apr. 27, 2016

(65) Prior Publication Data

US 2017/0005100 A1    Jan. 5, 2017

(30) Foreign Application Priority Data

Jul. 2, 2015   (KR) .................. 10-2015-0094935

(51) Int. Cl.
  *H01L 27/108*    (2006.01)
  *H01L 23/522*    (2006.01)

(52) U.S. Cl.
  CPC ...... *H01L 27/10897* (2013.01); *H01L 23/522* (2013.01); *H01L 23/5226* (2013.01)

(58) Field of Classification Search
  CPC ................. H01L 23/522; H01L 23/5226
  See application file for complete search history.

(56) References Cited

U.S. PATENT DOCUMENTS

| 6,023,099 | A | 2/2000 | Komuro |
| 6,956,289 | B2 | 10/2005 | Kunikiyo |
| 8,441,041 | B2 | 5/2013 | Fang et al. |
| 8,921,982 | B2 | 12/2014 | Tomita |
| 2002/0173111 | A1 | 11/2002 | Kasai |
| 2006/0278918 | A1 | 12/2006 | Inoue |
| 2008/0017965 | A1* | 1/2008 | Nomura ............... H01L 23/564 257/685 |
| 2010/0251694 | A1* | 10/2010 | Hugus ................... C06B 45/00 60/253 |
| 2015/0035156 | A1 | 2/2015 | Ichinose et al. |
| 2016/0172269 | A1* | 6/2016 | Ichikura ............. H01L 23/3677 257/712 |
| 2017/0040371 | A1* | 2/2017 | Izuhara ............. H01L 27/14634 |

FOREIGN PATENT DOCUMENTS

| JP | 2002-343942 | 11/2002 |
| KR | 10-2001-0061518 A | 7/2001 |
| KR | 10-2010-0103992 A | 9/2010 |

* cited by examiner

*Primary Examiner* — Mounir Amer
(74) *Attorney, Agent, or Firm* — Muir Patent Law, PLLC

(57) ABSTRACT

A semiconductor device may include a plurality of dummy wirings formed on a substrate at different vertical levels and electrically floated and a plurality of dummy contact plugs each electrically connected between two adjacent dummy wirings of the plurality of dummy wiring of the plurality of dummy wirings. No dummy wiring of the plurality of dummy wirings is electrically connected to a terminal of any one of a plurality of transistors included in the substrate.

19 Claims, 15 Drawing Sheets

SEMICONDUCTOR DEVICE INCLUDING DUMMY METAL

CROSS-REFERENCE TO RELATED APPLICATION

This application claims priority under 35 U.S.C. § 119 to Korean Patent Application No. 10-2015-0094935, filed on Jul. 2, 2015, in the Korean Intellectual Property Office, the disclosure of which is incorporated herein in its entirety by reference.

BACKGROUND

The present disclosure relates to a semiconductor device, and more particularly, to a semiconductor device having a stack wiring structure.

Owing to the high integration of semiconductor devices, the design rule for elements of semiconductor devices has been reduced. In a highly scaled semiconductor device, distances between a plurality of wirings and a plurality of contact plugs interposed between the plurality of wirings have gradually been reduced, and the number of stacked has wirings increased.

Additional processing due to a refined pattern and stacked wiring structure may worsen damage to a substrate and adversely affect the operating speed and refresh characteristics of the semiconductor device.

SUMMARY

The present disclosure provides a semiconductor device that may inhibit damage to a substrate due to a refined pattern and stacked wiring structure and may improve an operating speed and refresh characteristics.

According to example embodiments, there is provided a semiconductor device including a plurality of dummy wirings formed on a substrate at different vertical levels and electrically floated, each of the plurality of dummy wirings extending in a horizontal direction parallel to a top surface of the substrate; and a plurality of dummy contact plugs each electrically connected between two adjacent dummy wirings of the plurality of dummy wirings, each of the plurality of dummy contact plugs extending in a vertical direction perpendicular to the top surface of the substrate, wherein no dummy wiring of the plurality of dummy wirings is electrically connected to a terminal of any one of a plurality of transistors included in the substrate.

At least two pairs of adjacent dummy wirings among the plurality of dummy wirings may be respectively electrically connected via at least one of the plurality of dummy contact plugs.

At least first adjacent dummy wirings among the plurality of dummy wirings may be electrically connected via at least two of the plurality of dummy contact plugs.

The dummy contact plugs may include a dummy direct contact directly connecting at least one of the plurality of dummy wirings to the substrate.

At least two elements among the plurality of dummy wirings and the plurality of dummy contact plugs may form a continuous material movement path to allow hydrogen to diffuse through the continuous material movement path.

The dummy direct contact may be connected to a device isolation layer formed in the substrate or an active area defined by the device isolation layer in the substrate and is electrically floated in the substrate.

At least one of the plurality of dummy contact plugs other than the dummy direct contact may not overlap with the dummy direct contact in the vertical direction.

The substrate may include a cell array region and a peripheral circuit region, and the plurality of dummy contact plugs may be formed in the peripheral circuit region.

At least two elements among the plurality of dummy wirings and the plurality of dummy contact plugs may form a continuous material movement path, wherein the continuous material movement path includes at least n vertical sections perpendicular to the top surface of the substrate and at least m horizontal sections parallel to the top surface of the substrate, and wherein a total combined distance of the m sections is greater than or equal to a total combined distance of the n sections.

The plurality of dummy wirings may include a plurality of first dummy wirings being spaced apart from each other on the substrate at a first vertical level and a second dummy wiring at a second vertical level different from the first vertical level, and wherein the second dummy wiring is connected to the plurality of first dummy wirings via the plurality of dummy contact plugs.

At least two of the plurality of dummy wirings may extend in different directions in relation to each other.

Each of the dummy contact plugs may have a rod shape extending in the vertical direction, and wherein, in a plan view, a first width of each of the dummy contact plugs in a first direction and a second width of the each of the dummy contact plugs in a second direction perpendicular to the first direction are less than or equal to a width of each of the dummy wirings in the first direction.

According to example embodiments, there is provided a semiconductor device including: first, second, third, and fourth dummy wirings sequentially formed on a substrate from a low level, each of the first, second, third, and fourth dummy wirings extending in a horizontal direction parallel to a top surface of the substrate, and electrically floated; and a plurality of dummy contact plugs each electrically connecting adjacent dummy wirings among the first, second, third, and fourth dummy wirings, each of the plurality of dummy contact plugs extending in a vertical direction perpendicular to the top surface of the substrate, wherein no dummy wiring of the first, second, third, and fourth dummy wirings is electrically connected to a terminal of any one of a plurality of transistors included in the substrate.

The plurality of dummy contact plugs may include a first dummy contact plug connecting the first and second dummy wirings and a second dummy contact plug connecting the third and fourth dummy wirings, and wherein the second and third dummy wirings may be not connected via at least one of the plurality of dummy contact plugs.

The substrate and the first dummy wiring may not be electrically connected.

According to example embodiments, there is provided a semiconductor device including: a semiconductor substrate, a plurality of dummy metal lines formed at different vertical levels from the semiconductor substrate, each of the plurality of dummy metal lines extending in a horizontal direction parallel to a top surface of the semiconductor substrate, a plurality of insulating layers each disposed below a corresponding dummy metal line, and one or more dummy contact plugs extending in a vertical direction perpendicular to the top surface of the semiconductor substrate and electrically connecting at least two of the plurality of dummy metal lines. At least one of the dummy metal lines extends in a different direction from others.

BRIEF DESCRIPTION OF THE DRAWINGS

Exemplary embodiments of the present disclosure will be more clearly understood from the following detailed description taken in conjunction with the accompanying drawings in which.

DETAILED DESCRIPTION OF THE EMBODIMENTS

Figure 1:
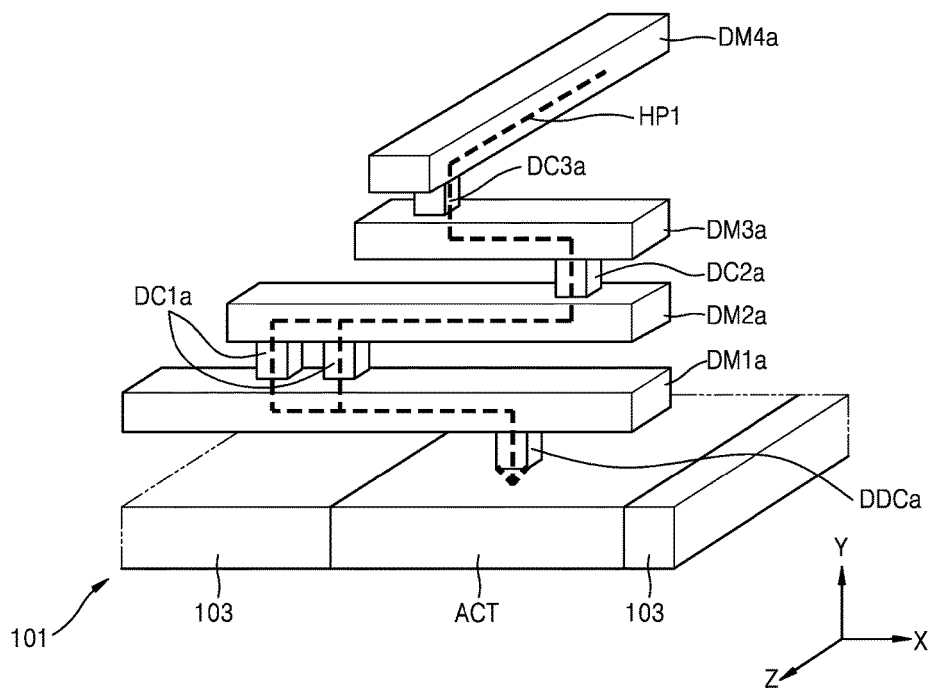
FIG. 1 is a schematic perspective view of a semiconductor device according to exemplary embodiments.

The present disclosure will now be described more fully hereinafter with reference to the accompanying drawings, in which exemplary embodiments of the disclosure are shown. This inventive concept may, however, be embodied in different forms and should not be construed as limited to the embodiments set forth herein. Like reference numerals in the drawings denote like elements, and thus their description will be omitted.

It will be understood that, although the terms "first", "second", etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless explicitly so defined herein.

When some embodiments may be embodied otherwise, respective process steps described herein may be performed otherwise. For example, two process steps described in a sequential order may be performed at substantially the same time or in reverse order unless otherwise noted.

Variations from the shapes of the illustrations as a result, for example, of manufacturing techniques and/or tolerances, are to be expected. Thus, embodiments of the present disclosure should not be construed as limited to the particular shapes of regions illustrated herein but are to include deviations in shapes that result, for example, from manufacturing. As used herein, the singular terms "a," "an" and "the" are intended to include the plural forms as well, unless the context clearly indicates otherwise. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact" refers to direct contact, unless the context indicates otherwise.

It will be further understood that the terms such as "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless the context indicates otherwise, terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a schematic perspective view of a semiconductor device 10 according to exemplary embodiments.

As used herein, a semiconductor device may refer to any of the various devices such as shown in FIGS. 1 through 11, and may also refer, for example, to a transistor or a device such as a semiconductor chip (e.g., memory chip and/or logic chip formed from a wafer), a stack of semiconductor chips, a semiconductor package including one or more semiconductor chips stacked on a package substrate, or a package-on-package device including a plurality of packages.

An electronic device, as used herein, may refer to one of these devices and may also include products that include these devices, such as a memory module, a hard drive including additional components, a mobile phone, laptop, tablet, desktop, camera, server, computing system, or other consumer electronic device, etc.

Referring to FIG. 1, the semiconductor device 10 may include first, second, third, and fourth dummy wirings (or, dummy metal lines) DM1a, DM2a, DM3a, and DM4a that are formed on a substrate 101 at different vertical levels and are electrically floated. A first dummy contact plug DC1a that directly electrically connects the first and second dummy wirings DM1a and DM2a, a second dummy contact plug DC2a that directly electrically connects the second and third dummy wirings DM2a and DM3a, a third dummy contact plug DC3a that directly electrically connects the third and fourth dummy wirings DM3a and DM4a, and a dummy direct contact DDCa that directly connects the first dummy wiring DM1a and the substrate 101. For example, the first, second, and third dummy contact plugs DC1a, DC2a, and DC3a and the dummy direct contact DDCa may not overlap with each other in a direction (a Y direction of FIG. 1) perpendicular to a main surface (or, a top surface) of the substrate 101. For example, adjacent dummy wirings among the dummy wirings DM1a, DM2a, DM3a, and DM4a are electrically connected to each other via one of the dummy contact plugs DC1a, DC2a, and DC3a and the first dummy wiring DM1a and the substrate 101 may not be electrically connected to each other.

In example embodiments, each of the first, second, and third dummy contact plugs DC1a, DC2a, and DC3a and the dummy direct contact DDCa may overlap with at least one another in the Y direction of FIG. 1 perpendicular to the top surface of the substrate 101.

In example embodiments, the dummy direct contact DDCa may have the same material as the dummy contact plugs DC1a, DC2a, and DC3a.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. The term "electrically floated" may refer to, for example, a terminal does not connect to a voltage source (e.g., Vcc, Vpp, Vint, or etc.), a ground (Vss), a signal path, or a transistor of the semiconductor device 10.

The semiconductor device 10 may include a cell array region and a peripheral circuit region. The first, second, third, and fourth dummy wirings DM1a, DM2a, DM3a, and DM4a, the first, second, and third dummy contact plugs DC1a, DC2a, and DC3a, and the dummy direct contact DDCa may be formed in the peripheral circuit region but are not limited thereto.

The substrate 101 may include an active area ACT and a device isolation layer 103. The active area ACT may be defined by the device isolation layer 103.

The dummy direct contact DDCa may directly connect the substrate 101 and the first dummy wiring DM1a to each other. The dummy direct contact DDCa may be directly connected to the active area ACT that may be electrically floated. At least one of the first, second, and third dummy contact plugs DC1a, DC2a, and DC3a may not overlap with the dummy direct contact DDCa in the direction (the Y direction of FIG. 1) perpendicular to the main surface of the substrate 101.

In some exemplary embodiments, the dummy direct contact DDCa may be directly connected to the device isolation layer 103. This will be described in detail with reference to FIG. 6 below.

The first, second, third, and fourth dummy wirings DM1a, DM2a, DM3a, and DM4a may be formed on the substrate 101 sequentially from a lower level to a higher level. The first dummy wiring DM1a may extend in a first direction (an X direction of FIG. 1) at a first level that is the closest to the substrate 101. The second dummy wiring DM2a may extend in the first direction (the X direction of FIG. 1) at a second level higher than the first level. The third dummy wiring DM3a may extend in the first direction (the X direction of FIG. 1) at a third level higher than the second level. The fourth dummy wiring DM4a may extend in a second direction (a Z direction of FIG. 1) perpendicular to the first direction (the X direction of FIG. 1) at a fourth level higher than the third level.

However, structures of the first, second, third, and fourth dummy wirings DM1a, DM2a, DM3a, and DM4a according to the present disclosure are not limited thereto. Extension directions or shapes of the first, second, third, and fourth dummy wirings DM1a, DM2a, DM3a, and DM4a may be freely selected according to necessity. In some exemplary embodiments, the first, second, third, and fourth dummy wirings DM1a, DM2a, DM3a, and DM4a may extend in the same direction or at least two of the first, second, third, and fourth dummy wirings DM1a, DM2a, DM3a, and DM4a may extend in different directions.

The first, second, third, and fourth dummy wirings DM1a, DM2a, DM3a, and DM4a may be electrically floated so that the first, second, third, and fourth dummy wirings DM1a, DM2a, DM3a, and DM4a are not electrically connected to each other to activate a transistor or a signal path of the semiconductor device 10. In example embodiments, the first, second, third, and fourth dummy wirings DM1a, DM2a, DM3a, and DM4a may be formed in order to prevent a processing defect during the manufacture of the semiconductor device 10. For example, when wiring patterns necessary for electrical connection of the semiconductor device 10 are formed, and chemical mechanical polishing (CMP) is performed as subsequent processing, the dishing phenomenon may occur due to a difference in the concentration of the wiring patterns, which causes a product defect. Thus, the first, second, third, and fourth dummy wirings DM1a, DM2a, DM3a, and DM4a may be formed in order to secure the concentration of the wiring patterns at a similar level over a whole area of the substrate 101. The first, second, third, and fourth dummy wirings DM1a, DM2a, DM3a, and DM4a may be formed simultaneously with forming the wiring patterns necessary for electrical connection of the semiconductor device 10.

The first, second, and third dummy contact plugs DC1a, DC2a, and DC3a may be formed to electrically connect the first, second, third, and fourth dummy wirings DM1a, DM2a, DM3a, and DM4a to each other. The first and second dummy wirings DM1a and DM2a may be directly connected via the first dummy contact plug DC1a. The second and third dummy wirings DM2a and DM3a may be directly connected via the single second dummy contact plug DC2a. The third and fourth dummy wirings DM3a and DM4a may be directly connected via the single third dummy contact plug DC3a. However, the inventive concept is not limited to the number of each of the first, second, and third dummy contact plugs DC1a, DC2a, and DC3a.

In some exemplary embodiments, at least a pair of adjacent dummy wirings among the first, second, and third dummy contact plugs DC1a, DC2a, and DC3a may be connected via at least two dummy contact plugs, and thus each of the second and third dummy contact plugs DC2a and DC3a may be more than 2. The first dummy contact plug DC1a may be 1 or more than 3.

The first, second, and third dummy contact plugs DC1a, DC2a, and DC3a may have a pillar shape extending in the direction (the Y direction of FIG. 1) perpendicular to the substrate 101. For example, with regard to one of the first, second, and third dummy contact plugs DC1a, DC2a, and DC3a and two dummy wirings directly electrically connected to both sides of the one dummy contact plug. In a plan view, a width of the one dummy contact plug in a first direction (e.g., a Z direction of FIG. 4A) may be equal to or less than a width of each of the two dummy wirings in the first direction. This will be described in detail with reference to FIG. 4 below.

As described above, the dummy direct contact DDCa may directly connect the substrate 101 and the first dummy wiring DM1a to each other, and the first, second, and third dummy contact plugs DC1a, DC2a, and DC3a may respectively directly electrically connect the first, second, third, and fourth dummy wirings DM1a, DM2a, DM3a, and DM4a to each other. Accordingly, a continuous material movement path HP1 may be formed between the substrate 101 and the fourth dummy wiring DM4a. A great amount of hydrogen may be supplied to the substrate 101 through the continuous material movement path HP1. Hydrogen may cure a dangling bond defect of the surface of the substrate 101, thereby improving an operating speed and refresh characteristics and increasing the reliability of the semiconductor device 10.

In more detail, a dark current may be generated due to refined patterns of the semiconductor device 10 and stacked wirings. The dark current may be generated without applying a voltage to semiconductor device 10 and by defects present in the substrate 101 or a dangling bond.

The dangling bond may be a defect that may occur on the surface of the substrate 101 when the substrate 101 is processed using oxidation or etching processing and indicates a bonding state (e.g., (—Si—O),(—Si—)) where outermost electrons of atoms present in the surface of the substrate 101 are not completely bonded but are cut off.

Electrons may be generated from the dangling bond that occurs on the surface of the substrate 101 and spread to a device region (e.g., a region including transistors or circuits) of the semiconductor device 10. The device region may be subjected to a state where charges are easy to be generated without applying a voltage to semiconductor device 10. If numerous dangling bonds are present in the substrate 101, numerous charges may be generated without applying a voltage to semiconductor device 10, and may react like a voltage is applied to semiconductor device 10, and thus the charges exhibit an abnormal behavior such as noise or dark current. Thus, it is necessary to remove the dangling bond defect of the substrate 101.

For example, the dangling bond defect of the substrate 101 may be cured by bonding hydrogen. Thus, a sufficient amount of hydrogen needs to be supplied to the substrate 101 in order to remove the dangling bond defect of the surface of the substrate 101. The semiconductor device 10 of the present disclosure may form the continuous material movement path HP1 by introducing the plurality of dummy contact plugs DC1a, DC2a, and DC3a that electrically connect the plurality of dummy wirings DM1a, DM2a, DM3a, and DM4a and the dummy direct contact DDCa that connects the plurality of dummy wirings DM1a, DM2a, DM3a, and DM4a to the substrate 101, thereby effectively removing the dangling bond defect by supplying a great quantity of hydrogen included in an interlayer insulating layer provided on the substrate 101 into the substrate 101.

Although hydrogen may generally diffuse only using the interlayer insulating layer and the dummy wirings DM1a, DM2a, DM3a, and DM4a, hydrogen may not diffuse due to etch stop layers disposed between the dummy wirings DM1a, DM2a, DM3a, and DM4a, As the number of stacked wirings increases, since a distance between an upper dummy wiring and the substrate 101 increases, an insufficient amount of hydrogen may be supplied from the upper dummy wiring. Accordingly, it may be difficult to cure the dangling bond present in the substrate 101 using hydrogen.

Although a method of reducing a deposition temperature of the interlayer insulating layer may be used to supply hydrogen to the substrate 101, there may be a problem that a whole cell region may be defective due to the collapse of wirings. Although a method of increasing a temperature and time may be used during a subsequent alloy process, the collapse of wirings and an increase in the processing time may be problematic.

In example embodiments, the dummy contact plugs DC1a, DC2a, and DC3a and the dummy direct contact DDCa according to the present disclosure may connect the dummy wirings DM1a, DM2a, DM3a, and DM4a that are formed through an etch stop layer, and thus a sufficient amount of hydrogen may diffuse to the substrate 101 through the continuous material movement path HP1. The dummy contact plugs DC1a, DC2a, and DC3a and the dummy direct contact DDCa according to the present disclosure may be simultaneously formed during an existing process of forming a contact plug and a direct contact for activating a transistor or a signal path of the semiconductor device 10, and thus no additional process may be necessary. Accordingly, the refresh characteristic of the semiconductor device 10 may be improved without additional processing time and deterioration of wirings.

In some exemplary embodiments, the dummy direct contact DDCa may be omitted. When the dummy direct contact DDCa is omitted, a short discontinuous section may occur in a continuous material movement path based on a conductive material. For example, hydrogen may diffuse through the interlayer insulating layer even in the discontinuous section, and thus a sufficient amount of hydrogen may be supplied to the substrate 101. This will be described in detail with reference to FIG. 7 below.

In some exemplary embodiments, at least two pairs of adjacent dummy wirings among the first, second, third, and fourth dummy wirings DM1a, DM2a, DM3a, and DM4a may be connected via at least two dummy contact plugs among the first, second, and third dummy contact plugs DC1a, DC2a, and DC3a. Thus, one of the first, second, and third dummy contact plugs DC1a, DC2a, and DC3a may be omitted.

When one of the first, second, and third dummy contact plugs DC1a, DC2a, and DC3a is omitted, the short discontinuous section may occur in the continuous material movement path based on the conductive material. For example, hydrogen may diffuse through the interlayer insulating layer even in the discontinuous section, and thus a sufficient amount of hydrogen may be supplied to the substrate 101. This will be described in detail with reference to FIG. 8 below.

The number of each of the first, second, third, and fourth dummy wirings DM1a, DM2a, DM3a, and DM4a present at each level is 1 in FIG. 1 but the inventive concept is not limited thereto. In some exemplary embodiments, one of the first, second, and third dummy contact plugs DC1a, DC2a, and DC3a may include at least two dummy contact plugs and connect a plurality of dummy wirings that are spaced and extend at a first level and another dummy wiring extending at a second level different from the first level. This will be described in detail with reference to FIG. 9 below.

Figure 2:
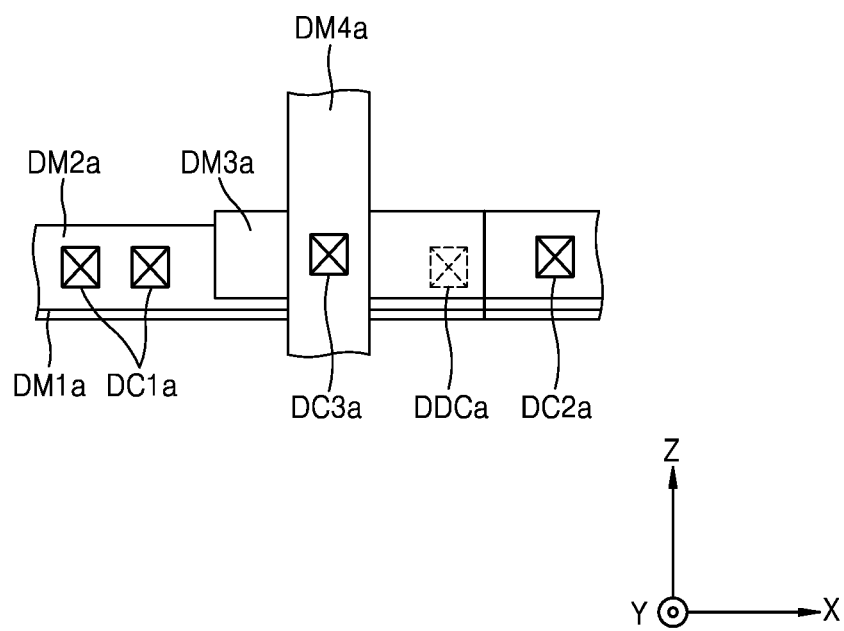
FIG. 2 is a schematic layout of the semiconductor device of FIG. 1 according to exemplary embodiments.

FIG. 2 is a schematic layout of the semiconductor device 10 of FIG. 1 according to exemplary embodiments. The same reference numerals are used to denote the same elements as in FIG. 1, and detailed descriptions thereof are omitted in order to avoid redundancy.

Referring to FIG. 2, the first, second, third, and fourth dummy wirings DM1a, DM2a, DM3a, and DM4a, the first, second, and third dummy contact plugs DC1a, DC2a, and DC3a, and the dummy direct contact DDCa included in the semiconductor device 10 described with reference to FIG. 1 above are illustrated.

The first, second, and third dummy contact plugs DC1a, DC2a, and DC3a, and the dummy direct contact DDCa may not overlap with each other in a direction (a Y direction of FIG. 2) perpendicular to a main (e.g., top) surface of a substrate. For example, a continuous material movement path from the fourth dummy wiring DM4a to the substrate may increase. Thus, a range of the first, second, third, and fourth dummy wirings DM1a, DM2a, DM3a, and DM4a included in the continuous material movement path may increase. Accordingly, a contact area between the first, second, third, and fourth dummy wirings DM1a, DM2a, DM3a, and DM4a included in the continuous material movement path and an interlayer insulating layer may increase, and thus hydrogen may be smoothly supplied from the interlayer insulating layer.

Figure 3A:
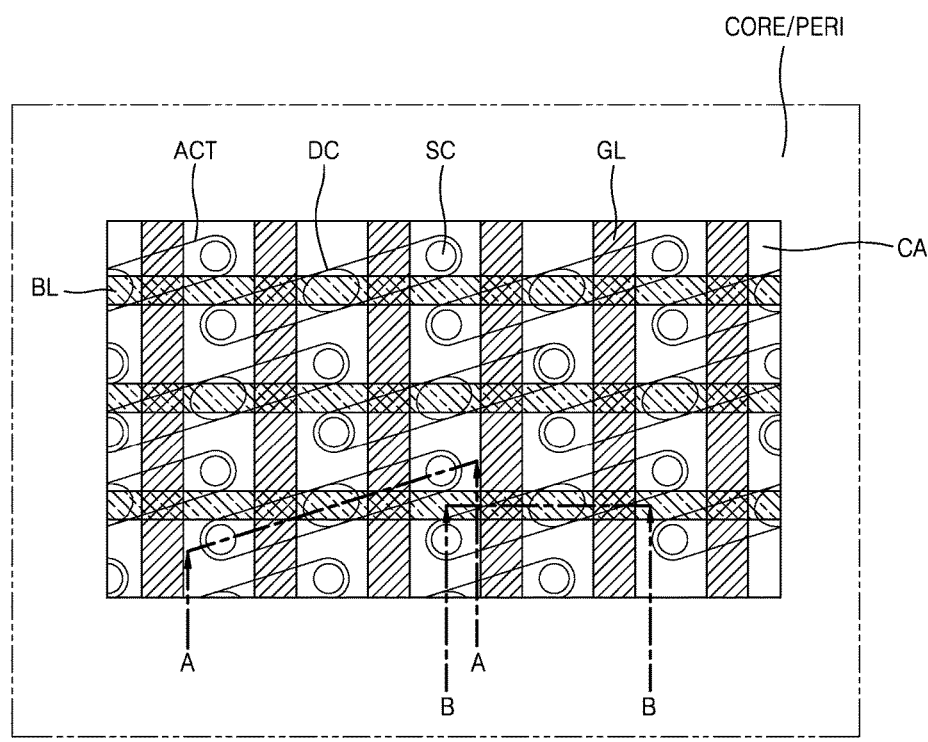
FIGS. 3A and 3B are cross-sectional views of a semiconductor device according to exemplary embodiments.
Figure 3B:
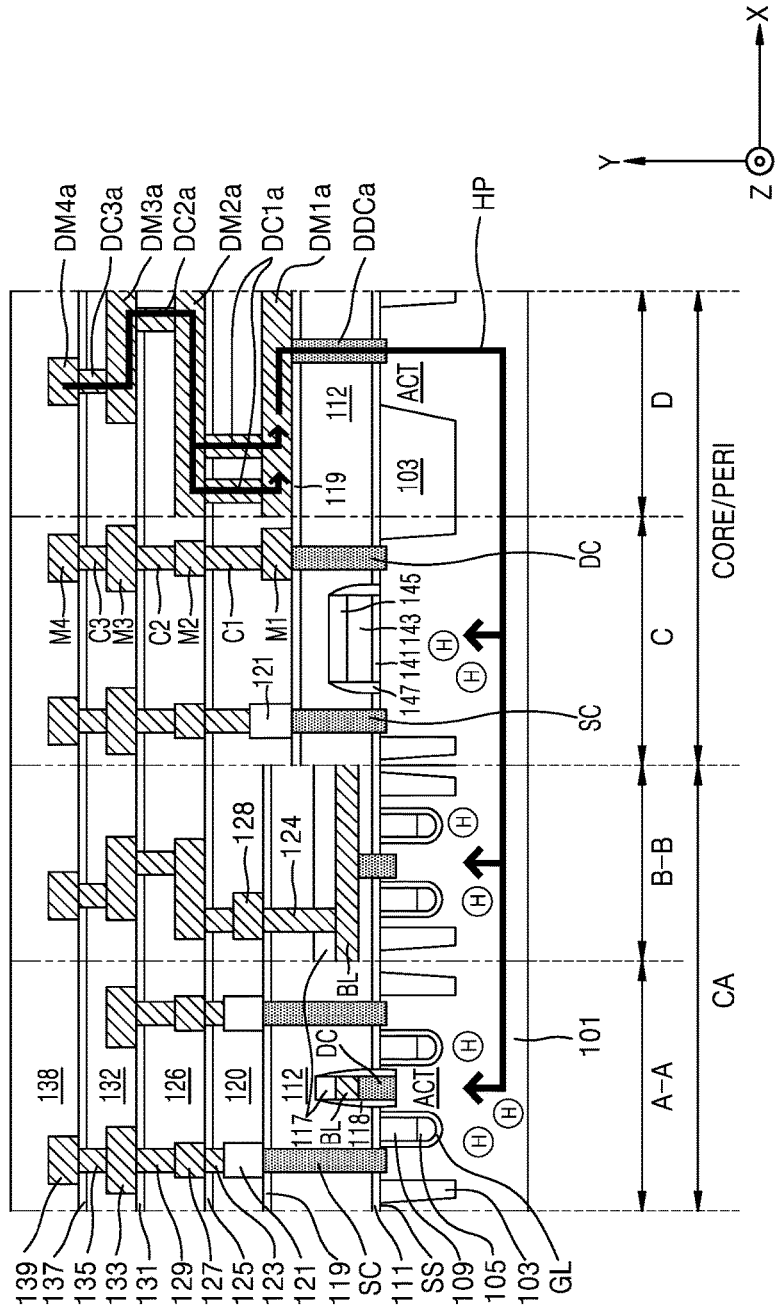

FIGS. 3A and 3B are a schematic layout and a cross-sectional view of a cell array region CA and a peripheral circuit region CORE/PERI of the semiconductor device 10 according to exemplary embodiments. A-A and B-B regions of the cell array region CA of FIG. 3B may respectively indicate cross-sections of portions corresponding to A-A and B-B lines of FIG. 3A. A region C of the peripheral circuit region CORE/PERI may indicate an electrically driven region (e.g., a transistor or a signal path in the region C is connected to the voltage source or the ground) and a region D thereof may indicate an electrically floated region (e.g., a transistor or a signal path in the region D is not connected to the voltage source or the ground). The region D is a cross-section of the semiconductor device 10 of FIGS. 1 and 2.

Referring to FIG. 3A, the semiconductor device 10 may be divided by the cell array region CA and the peripheral circuit region CORE/PERI.

The cell array region CA may be disposed in the center, and the peripheral circuit region CORE/PERI may be disposed outside the cell array region CA but the inventive concept is not limited thereto. The cell array region CA and the peripheral circuit region CORE/PERI may have an optionally appropriate layout.

In some exemplary embodiments, the peripheral circuit region CORE/PERI may be disposed inside the cell array region CA. Although a region, excluding the cell array region CA, may be referred to as a peripheral circuit region, the peripheral circuit region CORE/PERI may include a core region.

In example embodiments, the cell array region CA may include a plurality of memory cells and the core region may include a circuit (e.g., a row decoder, a column decoder, a sense amplifier, or I/O interface, etc.). For example, each of the plurality of memory cells, the row decoder, the sense amplifier, and the I/O interface may include one or more transistors.

The cell array region CA may include a plurality of active areas ACT defined by a device isolation layer 103, a plurality of gate lines GL, and a plurality of bit lines BL. Regions of the active areas ACT, in which the gate lines GL are not formed, may be a source region and a drain region. A storage node contact SC that electrically connects the source region to an information storage unit, for example, a capacitor, may be formed on the source region. A direct contact DC that electrically connects the drain region to the bit lines BL may be formed on the drain region. The active areas ACT may extend at an optional angle with respect to extension directions of the bit lines BL and the gate lines GL.

In example embodiments, the source and drain regions of the active areas ACT may have higher impurity concentration than other regions of the active areas ACT.

The gate lines GL of the cell array region CA may consist of a recessed channel array transistor, but are not limited thereto. Although not shown in FIG. 3A, planar transistors may be formed in the peripheral circuit region CORE/PERI.

Referring to FIG. 3B, the substrate 101 may include the active areas ACT defined by the device isolation layer 103 in the cell array region CA and the peripheral circuit region CORE/PERI. Etch stop layers 111, 119, 125, 131, and 137 and interlayer insulating layers 112, 120, 126, 132, and 138 may be alternately formed on the substrate 101.

The substrate 101 may include silicon (Si) as a semiconductor wafer. In some exemplary embodiments, the substrate 101 may include a semiconductor atom such as germanium (Ge) or a compound semiconductor such as silicon carbide (SiC), gallium arsenide (GaAs), indium arsenide (InAs), and indium phosphide (InP). In some exemplary embodiments, the substrate 101 may have a silicon on insulator (SOI) structure. For example, the substrate 101 may include a buried oxide (BOX) layer. In some exemplary embodiments, the substrate 101 may include a conductive region, for example, a well doped with impurities or a structure doped with impurities. The substrate 101 may have various device isolation structures such as a shallow trench isolation (STI) structure.

In some exemplary embodiments, the device isolation layer 103 may include an oxide layer, a nitride layer, or a combination of the oxide layer and the nitride layer but is not limited thereto. The device isolation layer 103 may have a single layer structure including one type of insulating layer or a multiple layer structure including a combination of at least two types of insulating layers.

The etch stop layers 111, 119, 125, 131, and 137 may include materials having an etching selectivity with the interlayer insulating layers 112, 120, 126, 132, and 138. For example, the etch stop layers 111, 119, 125, 131, and 137 may be nitride layers, and the interlayer insulating layers 112, 120, 126, 132, and 138 may be oxide layers.

In example embodiments, the A-A region of the cell array region CA may include a plurality of first gate structures in the active area ACT. The first gate structures may be formed in a trench having a predetermined depth from a top surface of the substrate 101 and may include a gate insulating layer 105, the gate lines GL, and a capping layer 109. The etch stop layer 111 and the interlayer insulating layer 112 may be sequentially formed on the substrate 101. The drain region may be formed on the substrate 101 between the adjacent first gate structures. The source region may be formed on the substrate 101 outside the first gate structures.

The bit lines BL may be electrically connected to the drain region via the direct contact DC that passes through the etch stop layer 111. A capping layer 117 may be formed on top surfaces of the bit lines BL. Spacers 118 may be formed on side surfaces of the bit lines BL to maintain an electrically insulating state from a periphery.

An information storage unit 121 may be electrically connected to the source region via the storage contact SC that passes through the etch stop layers 111 and 119 and the interlayer insulating layer 112. The information storage unit 121 may be electrically connected to upper wirings 127, 133, and 139 via a plurality of contact plugs 123, 129, and 135 that pass through the plurality of interlayer insulating layers 120, 126, 132, and 138 and the etch stop layers 125, 131, and 137.

The information storage unit 121 may be a capacitor including a dielectric layer and upper and lower electrodes but the inventive concept is not limited thereto. In some exemplary embodiments, the information storage unit 121 may include a reference pattern, a free pattern, and a tunnel barrier pattern disposed between the reference pattern and the free pattern. The reference pattern may have a fixed magnetization direction in one direction. The free pattern may have a changeable magnetization direction parallel or semi-parallel to the magnetization direction of the reference pattern. The magnetization directions of the reference pattern and the free pattern may be parallel to one surface of the tunnel barrier pattern contacting the free pattern. When the magnetization direction of the free pattern is parallel to the magnetization direction of the reference pattern, the information storage unit 121 may have a first resistance value. When the magnetization direction of the free pattern is semi-parallel to the magnetization direction of the reference pattern, the information storage unit 121 may have a second resistance value greater than the first resistance value. The information storage unit 121 may store logic value using a difference in the resistance values.

In some exemplary embodiments, the information storage unit 121 may include a phase shift material pattern and an upper electrode that are sequentially stacked. The phase shift material pattern may be shifted to a crystalline state or an amorphous state due to a temperature of supplied heat and/or a supply time, etc. The phase shift material pattern of the crystalline state may have a lower non-resistance than the phase shift material pattern of the amorphous state. The information storage unit 121 may store logic value using a difference in the non-resistance with respect to the state shift.

In some exemplary embodiments, the information storage unit 121 may include a lower electrode, the upper electrode, and a transition metal oxide pattern disposed between the lower and upper electrodes. At least one electrical path may be generated or extinguished in the transition metal oxide pattern using a program operation. Both ends of the electrical path may be connected to the lower and upper electrodes. When the electrical path is generated, the information storage unit 121 may have a low resistance value. When the electrical path is extinguished, the information storage unit 121 may have a high resistance value. The information storage unit 121 may store logic value using a difference in the resistance value according to the electrical path.

In addition to the above-described elements, a plurality of various types of individual devices may be formed on the substrate 101. The plurality of individual devices may include various microelectronic devices, for example, a metal oxide semiconductor field effect transistor (MOSFET), system large scale integration (LSI), an image sensor such as a CMOS imaging sensor (CIS), a micro-electromechanical system (MEMS), an active device, a passive device, etc. The plurality of individual devices may be electrically connected to the active area ACT of the substrate 101. The plurality of individual devices may be electrically separated from other neighboring individual devices via respective insulating layers.

In example embodiments, in the B-B region of the cell array region CA, the bit lines BL may be electrically connected to the drain region of the substrate 101 via the direct contact DC that passes through the etch stop layer 111 and the interlayer insulating layer 112. The bit lines BL may be connected to wirings 128 via contact plugs 124 that pass through the capping layer 117, the interlayer insulating layer 112, and the etch stop layer 119 that are sequentially formed on the bit lines BL. The wirings 128 may be electrically connected to upper wirings through a plurality of contact plugs, thereby applying voltages to the bit lines BL.

The bit lines BL, the wirings 127, 128, 133, and 139, the contact plugs 123, 124, 129, and 135, and the direct contact DC that are formed in the A-A and B-B regions of the cell array region CA may be elements requiring electrical connection and include conductive materials. In some exemplary embodiments, the bit lines BL, the wirings 127, 128, 133, and 139, and the contact plugs 123, 124, 129, and 135 that connect the bit lines BL to the wirings 127, 128, 133, and 139 may include a single layer or layers including at least one selected from, for example, W, WN, WC, Cu, CuSn, CuMg, CuNi, CuZn, CuPd, CuAu, CuRe, CuW, Ti, TiN, Ta, TaN, Ru, Co, Mn, WN, Ni, and NiB or an alloy thereof but are not limited thereto.

In the C region of the peripheral circuit region CORE/PERI, the substrate 101 may include the active area ACT defined by the device isolation layer 103. A second gate structure may be formed on the active area ACT. The second gate structure may include a gate insulating layer 141, a gate electrode 143, a capping layer 145, and a spacer 147 that are sequentially stacked on the substrate 101. A source region and a drain region may be formed in the substrate 101 exposed to both sides of the second gate structure. The interlayer insulating layer 112 and the etch stop layer 119 may be sequentially formed on the substrate 101 and the second gate structure. As shown in FIG. 3B, the etch stop layer 119 of the C region may be disposed at a different level as the etch stop layer 119 of the B-B region, but in other embodiments, may be disposed at the same level.

A first wiring M1 may be electrically connected to the drain region via the direct contact DC that passes through the interlayer insulating layer 112 and the etch stop layer 111. The first wiring M1 may be electrically connected to second, third, and fourth wirings M2, M3, and M4 via the first, second, and third contact plugs C1, C2, and C3 that pass through the interlayer insulating layer 120, 126, 132, and 138 and the etch stop layers 125, 131, and 137 that are sequentially formed on the first wiring M1. The first, second, third, and fourth wirings M1, M2, M3, and M4, the direct contact DC, and the first, second, and third contact plugs C1, C2, and C3 need electrical connection and may include the above-described conductive materials.

The information storage unit 121 may be connected to the source region via the storage contact SC that passes through the etch stop layers 111 and 119 and the interlayer insulating layer 112. The information storage unit 121 may be electrically connected to upper wirings via a plurality of contact plugs that pass through the interlayer insulating layers 120, 126, 132, and 138 and the etch stop layers 125, 131, and 137 on an upper side of the information storage unit 121.

In the A-A and B-B regions of the cell array region CA and the C region of the peripheral circuit region CORE/PERI, a process of etching a large area of the substrate 101 several times may be performed in order to form a plurality of various types of individual devices. Accordingly, many dangling bond defects may occur on a surface of the substrate 101, which may cause a dark current, and thus a transistor or a circuit of the semiconductor device 10 may behave abnormally.

The interlayer insulating layers 112, 120, 126, 132, and 138 formed on the substrate 101 may include a great quantity of hydrogen. For example, when hydrogen included in the interlayer insulating layers 112, 120, 126, 132, and 138 is appropriately diffused into the substrate 101, the dangling bond defects may be cured.

In general, the interlayer insulating layers 112, 120, 126, 132, and 138 may include oxide, and the etch stop layers 111, 119, 125, 131, and 137 may include nitride. Hydrogen diffusion efficiency of nitride may be much lower than that of oxide. Accordingly, although hydrogen diffuses well in one of the interlayer insulating layers 112, 120, 126, 132, and 138, since hydrogen does not diffuse in the etch stop layers 111, 119, 125, 131, and 137, it may be difficult to diffuse hydrogen to the substrate 101.

In the D region of the peripheral circuit region CORE/PERI, the substrate 101 may include the active area ACT defined by the device isolation layer 103. For example, since the active area ACT may be electrically floated, current for activating the semiconductor device 10 may not flow in the D region.

The etch stop layer 111 may be formed on the substrate 101. The first through fifth interlayer insulating layers 112, 120, 126, 132, and 138 may be sequentially formed on the etch stop layer 111. The etch stop layers 119, 125, 131, and 137 may be formed between adjacent interlayer insulating layers among the first through fifth interlayer insulating layers 112, 120, 126, 132, and 138.

The first, second, third, and fourth dummy wirings DM1a, DM2a, DM3a, and DM4a that are electrically floated may be sequentially formed on the first through fifth interlayer insulating layers 112, 120, 126, 132, and 138. Since the first, second, third, and fourth dummy wirings DM1a, DM2a, DM3a, and DM4a are electrically floated, the first, second, third, and fourth dummy wirings DM1a, DM2a, DM3a, and DM4a may not used to activate a transistor or a signal path of the semiconductor device 10. For example, the first, second, third, and fourth dummy wirings DM1a, DM2a, DM3a, and DM4a may be formed in order to prevent the dishing phenomenon due to a difference in the wiring pattern concentration during the manufacture of the semiconductor device 10.

The first dummy wiring DM1a may be physically connected to the active area ACT of the substrate 101 via the dummy direct contact DDCa that passes through the etch stop layer 111 and the first interlayer insulating layer 112. The first dummy wiring DM1a may be physically connected to the second, third, and fourth dummy wirings DM2a, DM3a, and DM4a via the first, second, and third dummy contact plugs DC1a, DC2a, and DC3a that pass through the interlayer insulating layers 120, 126, 132, and 138 and the etch stop layers 125, 131, and 137.

The first, second, third, and fourth dummy wirings DM1a, DM2a, DM3a, and DM4a may be formed when the wirings 127, 128, 133, and 139 of the cell array region CA are formed or when the first, second, third, and fourth wirings M1, M2, M3, and M4 of the C region of the peripheral circuit region CORE/PERI are formed. Accordingly, the first, second, third, and fourth dummy wirings DM1a, DM2a, DM3a, and DM4a may include conductive materials. In some exemplary embodiments, the first, second, third, and fourth dummy wirings DM1a, DM2a, DM3a, and DM4a may include a single layer or layers including at least one selected from, for example, W, WN, WC, Cu, CuSn, CuMg, CuNi, CuZn, CuPd, CuAu, CuRe, CuW, Ti, TiN, Ta, TaN, Ru, Co, Mn, WN, Ni, and NiB or an alloy thereof but are not limited thereto.

The dummy direct contact DDCa and the first, second, and third dummy contact plugs DC1a, DC2a, and DC3a may be connected to the substrate 101 (e.g., an active area ACT) and the first, second, third, and fourth dummy wirings DM1a, DM2a, DM3a, and DM4a that are electrically floated, and thus the dummy direct contact DDCa and the first, second, and third dummy contact plugs DC1a, DC2a, and DC3a may not be elements accompanied by an electrical flow. For example, the first, second, third, and fourth dummy wirings DM1a, DM2a, DM3a, and DM4a may not be electrically connected to a voltage source, a ground, a terminal of any one of transistors included in the substrate 101, or a signal path of the semiconductor device 10. In example embodiments, the dummy direct contact DDCa and the first, second, and third dummy contact plugs DC1a, DC2a, and DC3a may form a continuous material diffusion path that passes through the first through fifth interlayer insulating layers 112, 120, 126, 132, and 138 and the etch stop layers 111, 119, 125, 131, and 137. Accordingly, hydrogen included in the interlayer insulating layers 120, 126, 132, and 138 may be sufficiently supplied to the substrate 101 without interruption by the etch stop layers 119, 125, 131, and 137 along the material diffusion path. In particular, a metal material and a conductive semiconductor material may have better hydrogen diffusion efficiency than oxide and nitride, and thus the dummy direct contact DDCa and the first, second, and third dummy contact plugs DC1a, DC2a, and DC3a that include the metal material and the conductive semiconductor material may be an effective hydrogen diffusion path.

Figure 4A:
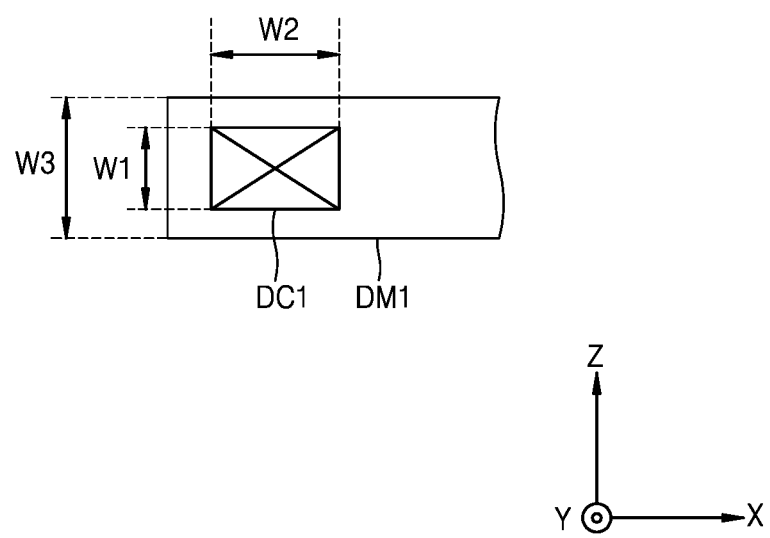
FIGS. 4A and 4B are diagrams for describing dummy contact plugs and dummy wirings according to exemplary embodiments.
Figure 4B:
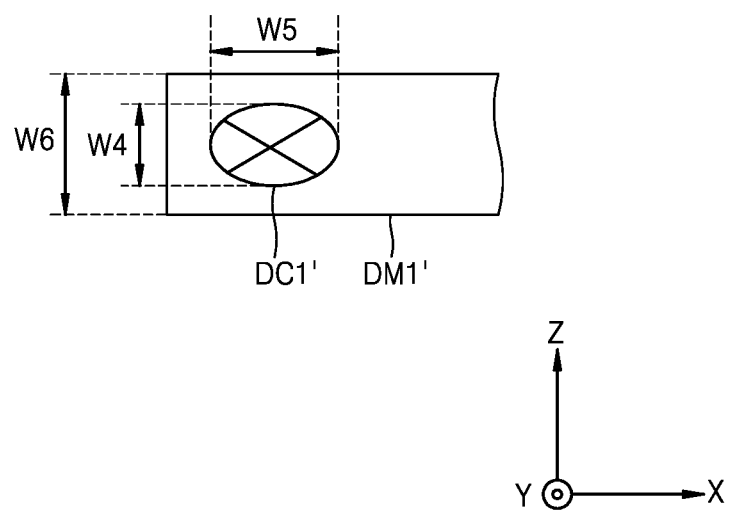

FIGS. 4A and 4B are diagrams for describing dummy contact plugs DC1 and DC1' and dummy wirings DM1 and DM1' according to exemplary embodiments.

Referring to FIG. 4A, the dummy contact plug DC1 connected to the dummy wiring DM1 may be a rod shape extending in a direction (the Y direction of FIG. 4A) perpendicular to a top surface of the dummy wiring DM1. For example, in a plan view, the dummy contact plug DC1 may have a rectangular shape. For example, a width W1 of the dummy contact plug DC1 in a first direction (a Z direction of FIG. 4A) and a width W2 of the dummy contact plug DC1 in a second direction (a X direction of FIG. 4A) perpendicular to the first direction may be less than or equal to a width W3 of the dummy wiring DM1 in the first direction.

Referring to FIG. 4B, the dummy contact plug DC1' connected to the dummy wiring DM1' may be a rod shape extending in a vertical direction (the Y direction of FIG. 4B) perpendicular to a top surface of the dummy wiring DM1'. For example, in a plan view, the dummy contact plug DC1' may have a circular or oval shape. For example, a width W4 of the dummy contact plug DC1' in a first direction (a Z direction of FIG. 4B) and a width W5 of the dummy contact plug DC1' in a second direction (a X direction of FIG. 4B) perpendicular to the first direction may be less than or equal to a width W6 of the dummy wiring DM1' in the first direction.

The dummy contact plugs DC1 and DC1' may be respectively electrically connected to two dummy wirings on top and bottom surfaces thereof. Thus, a maximum width and a minimum width of the cross-sections of the dummy contact plugs DC1 and DC1' may be less than or the same as a minimum width of each of the two dummy wirings.

Figure 5:
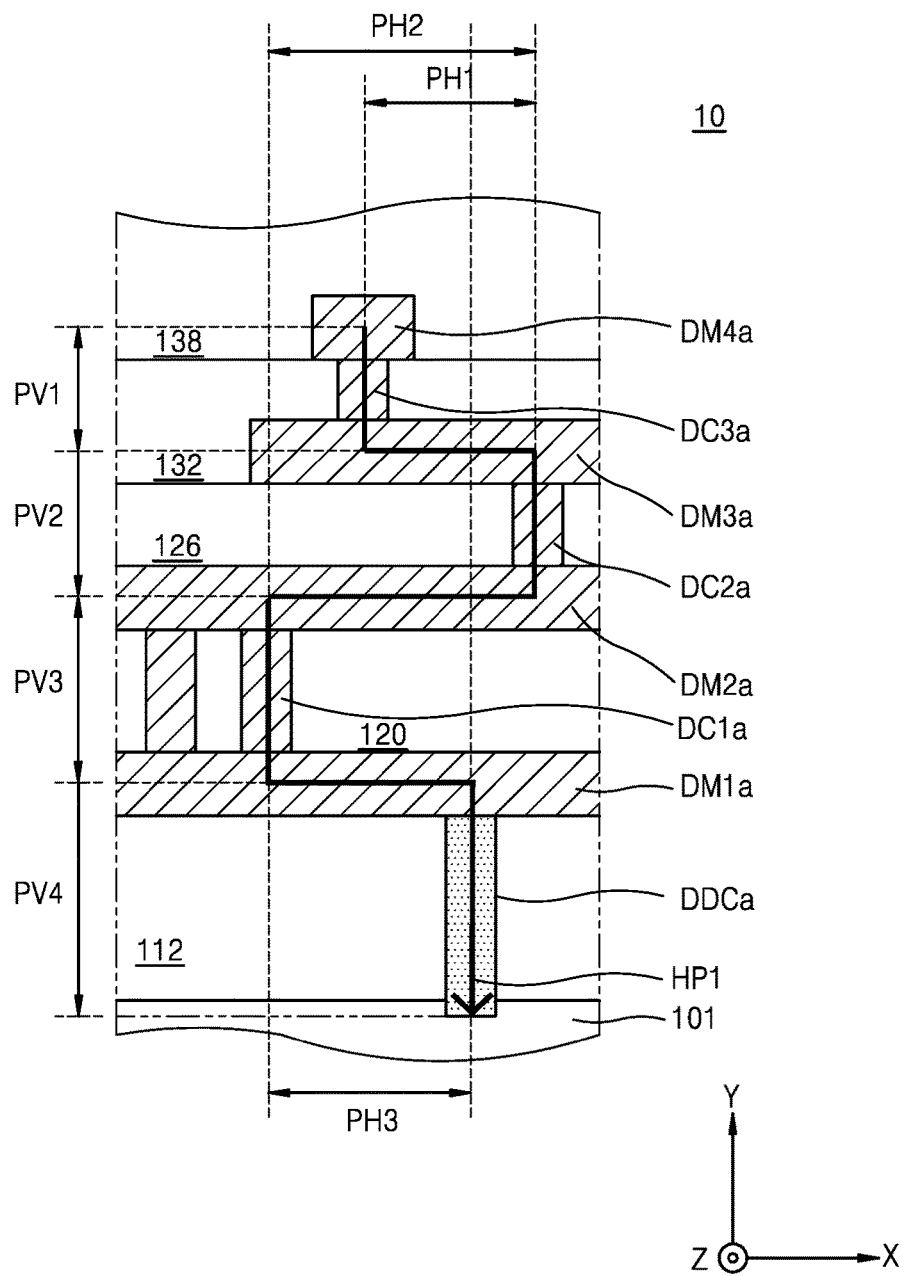
FIG. 5 is a diagram for describing a continuous material movement path of a D region of the semiconductor device of FIG. 1 according to exemplary embodiments.

FIG. 5 is a diagram for describing a continuous material movement path of the D region of the semiconductor device of FIG. 1 according to exemplary embodiments.

Referring to FIG. 5, the first, second, third, and fourth dummy wirings DM1a, DM2a, DM3a, and DM4a may be sequentially formed on the substrate 101. The first interlayer insulating layer 112 may be formed on the substrate 101. The second interlayer insulating layer 120 may be formed to cover the first dummy wiring DM1a on the first interlayer insulating layer 112. The third interlayer insulating layer 126 may be formed to cover the second dummy wiring DM2a on the second interlayer insulating layer 120. The fourth interlayer insulating layer 132 may be formed to cover the third dummy wiring DM3a on the third interlayer insulating layer 126. The fifth interlayer insulating layer 138 may be formed to cover the fourth dummy wiring DM4a on the fourth interlayer insulating layer 132. The first through fifth interlayer insulating layers 112, 120, 126, 132, and 138 may contact the first, second, third, and fourth dummy wirings DM1a, DM2a, DM3a, and DM4a, the first, second, and third dummy contact plugs DC1a, DC2a, and DC3a, and the dummy direct contact DDCa to supply hydrogen.

The dummy direct contact DDCa may be formed to pass through the first interlayer insulating layer 112 so as to connect the substrate 101 and the first dummy wiring DM1a to each other. The two first dummy contact plugs DC1a may be formed to pass through the second interlayer insulating layer 120 so as to connect the first dummy wiring DM1a and the second dummy wiring DM2a. The second dummy contact plug DC2a may be formed to pass through the third interlayer insulating layer 126 so as to connect the second dummy wiring DM2a and the third dummy wiring DM3a. The third dummy contact plug DC3a may be formed to pass through the fourth interlayer insulating layer 32 so as to connect the third dummy wiring DM3a and the fourth dummy wiring DM5a. Accordingly, the continuous material movement path HP1 from the substrate 101 and the fourth dummy wiring DM4a may be formed.

In example embodiments, at least two of the first, second, and third dummy contact plugs DC1a, DC2a, and DC3a and the dummy direct contact DDCa may be formed not to overlap with each other in a Y direction of FIG. 5.

In exemplary embodiments, the continuous material movement path HP1 may include first sections PV1, PV2, PV3, and PV4 that are vertical directions (the Y direction of FIG. 5) perpendicular to a top surface of the substrate 101 and second sections PH1, PH2, and PH3 that are horizontal directions (a X direction of FIG. 5) parallel to the top surface of the substrate 101. In example embodiments, a total combined distance of the second sections PH1, PH2, and PH3 may be greater than or equal to that of the first sections PV1, PV2, PV3, and PV4.

When the continuous material movement path HP1 increases, since a contact area of the first, second, third, and fourth dummy wirings DM1a, DM2a, DM3a, and DM4a and the first through fifth interlayer insulating layers 112, 120, 126, 132, and 138 increases, hydrogen may be more smoothly supplied from the first through fifth interlayer insulating layers 112, 120, 126, 132, and 138. Accordingly, the substrate 101 may receive a great quantity of hydrogen through the continuous material movement path HP1.

When the first, second, and third dummy contact plugs DC1a, DC2a, and DC3a and the dummy direct contact DDCa overlap with each other in the direction (the Y direction of FIG. 5) perpendicular to the top surface of the substrate 101, the continuous material movement path HP1 may be greatly reduced. Accordingly, a distance of the first, second, third, and fourth dummy wirings DM1a, DM2a, DM3a, and DM4a included in the continuous material movement path HP1 may be reduced, and thus hydrogen may not be sufficiently supplied from the first through fifth interlayer insulating layers 112, 120, 126, 132, and 138. Thus, when the first, second, and third dummy contact plugs DC1a, DC2a, and DC3a and the dummy direct contact DDCa are formed in a straight line, an effect of supplying hydrogen to the substrate 101 may be reduced.

Figure 6:
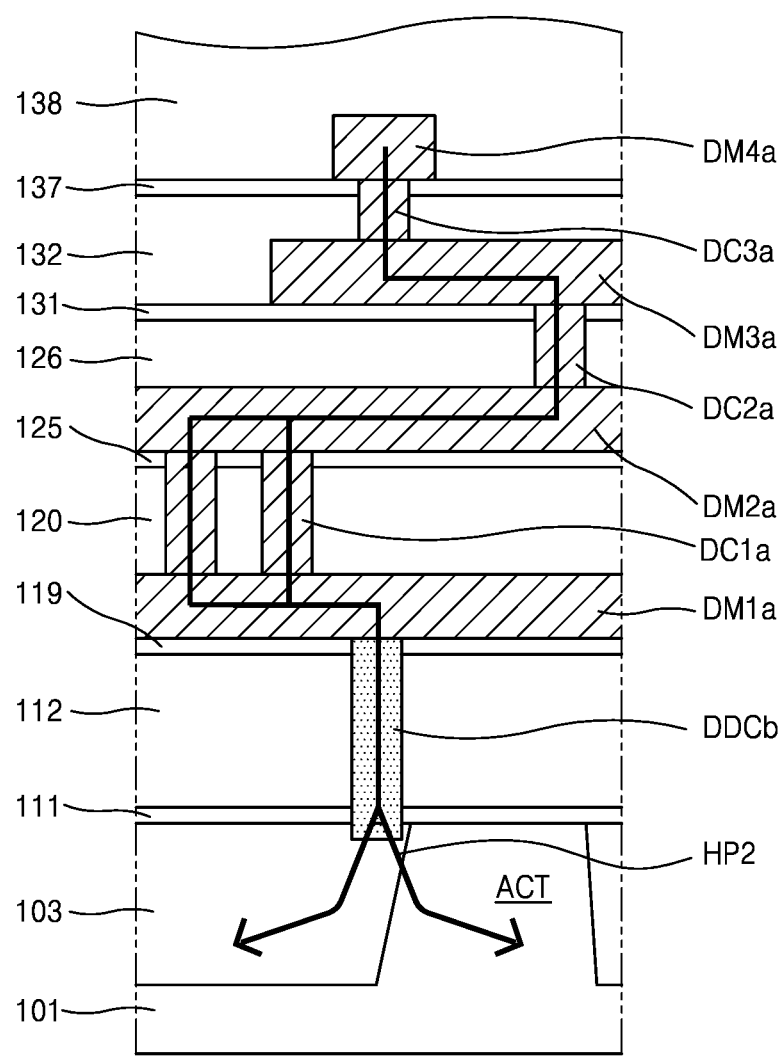
FIGS. 6 through 9 are cross-sectional views of semiconductor devices according to exemplary embodiments.

FIG. 6 is a cross-sectional view of a semiconductor device 20 according to exemplary embodiments. Although the semiconductor device 20 of FIG. 6 is similar to the semiconductor device 10 of FIG. 1, the semiconductor device 20 of FIG. 6 is different from the semiconductor device 10 of FIG. 1 that a dummy direct contact DDCb is directly connected to the device isolation layer 103.

Referring to FIG. 6, the substrate 101 may include the active area ACT and the device isolation layer 103. The device isolation layer 103 may be electrically floated. The device isolation layer 103 may be an oxide layer, a nitride layer, and or a combination of the oxide layer and the nitride layer but is not limited thereto. The device isolation layer 103 may have a single layer structure including one type of insulating layer or a multiple layer structure including a combination of at least two types of insulating layers.

The dummy direct contact DDCb may be formed to directly connect the device isolation layer 103 and the first dummy wiring DM1a, Accordingly, a continuous material movement path HP2 of the first, second, third, and fourth dummy wirings DM1a, DM2a, DM3a, and DM4a, the first, second, and third dummy contact plugs DC1a, DC2a, and DC3a, and the dummy direct contact DDCb may be directly connected to the substrate 101.

Hydrogen diffused to the device isolation layer 103 may diffuse to the cell array region CA, the C region and the D region of the peripheral circuit region CORE/PERI as described with reference to FIG. 3B above. Accordingly, a dangling bond defect that occurs on a surface of the substrate 101 may be cured.

Figure 7:
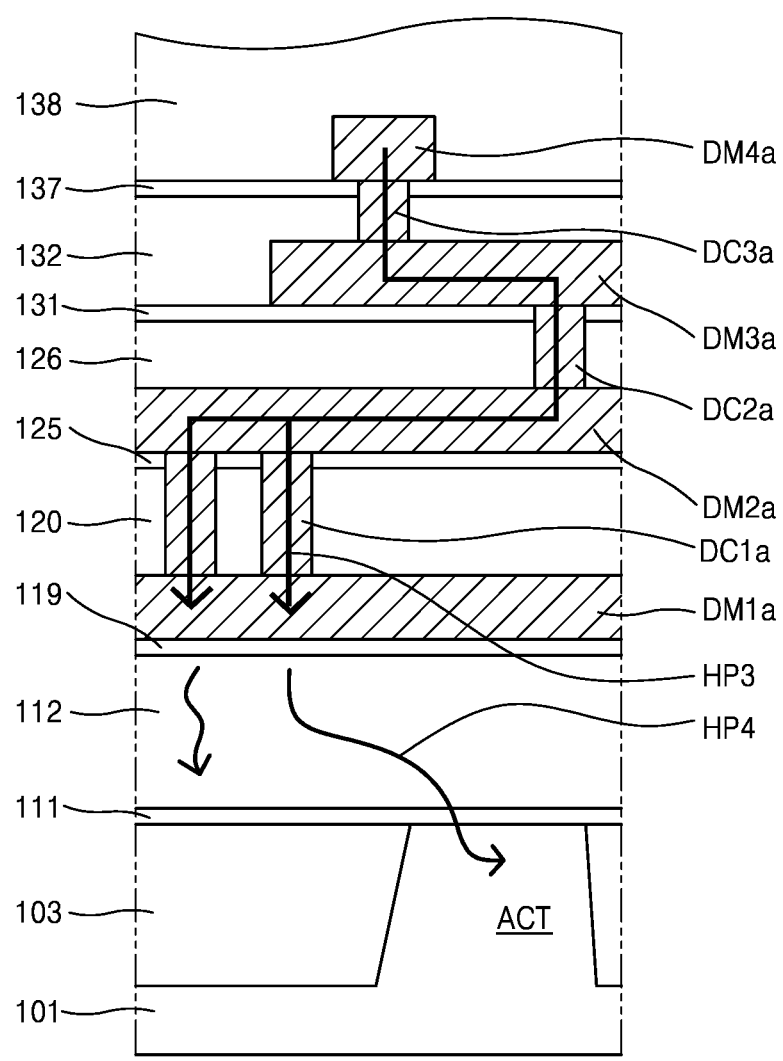

FIG. 7 is a cross-sectional view of a semiconductor device 30 according to exemplary embodiments. Although the semiconductor device 30 of FIG. 7 is similar to the semiconductor device 10 of FIG. 1, the semiconductor device 30 of FIG. 7 is different from the semiconductor device 10 of FIG. 1 that a dummy direct contact is omitted.

Referring to FIG. 7, the first, second, third, and fourth dummy wirings DM1a, DM2a, DM3a, and DM4a may form a first material movement path HP3 by physically forming the first, second, and third dummy contact plugs DC1a, DC2a, and DC3a. For example, the first dummy wiring DM1a may not be directly connected to the substrate 101. In example embodiments, the dummy direct contact DDCa of FIG. 3B may be omitted. When the first dummy wiring DM1a is not directly connected to the substrate 101, a short discontinuous section may be generated in a path from the first, second, third, and fourth dummy wirings DM1a, DM2a, DM3a, and DM4a to the substrate 101. For example, a great quantity of hydrogen may be also secured in the first material movement path HP3 via the first, second, and third dummy contact plugs DC1a, DC2a, and DC3a from the fourth dummy wiring DM4a provided on an upper portion to the first dummy wiring DM1a. A second material movement path HP4 may be formed via the interlayer insulating layer 112 in the discontinuous section, and thus hydrogen may diffuse. Thus, when the path from the first, second, third, and fourth dummy wirings DM1a, DM2a, DM3a, and DM4a to the substrate 101 includes the short discontinuous section, a sufficient amount of hydrogen may be supplied to the substrate 101.

Figure 8:
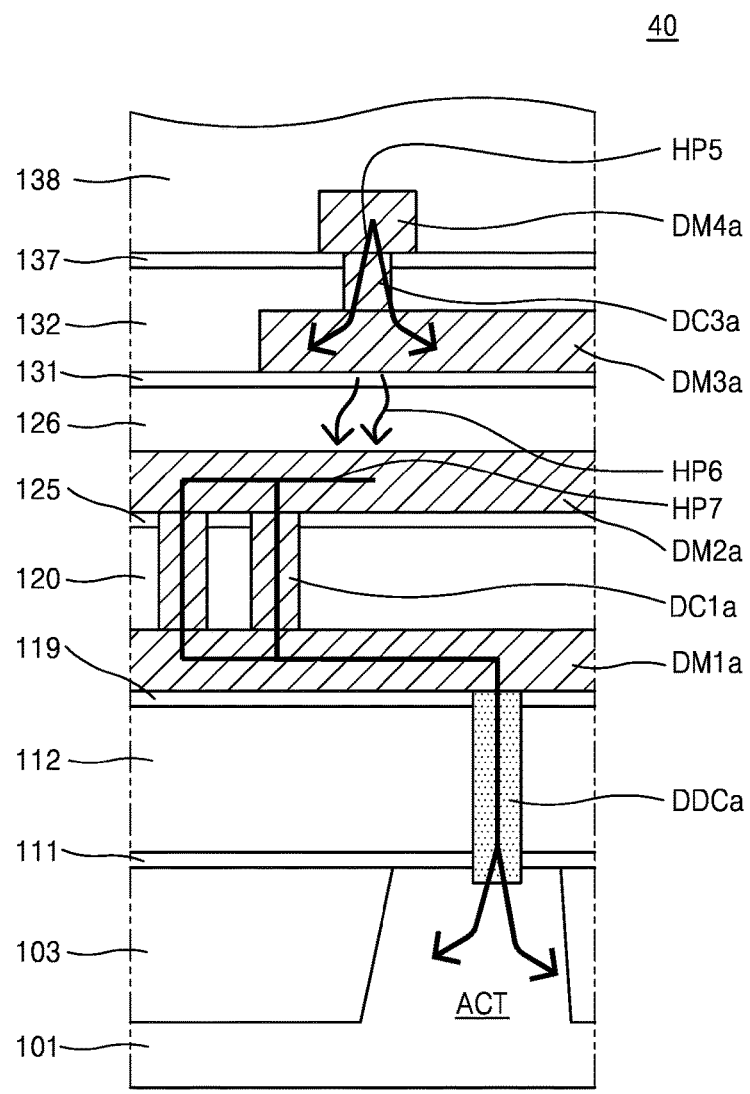

FIG. 8 is a cross-sectional view of a semiconductor device 40 according to exemplary embodiments. Although the semiconductor device 40 of FIG. 8 is similar to the semiconductor device 10 of FIG. 1, the semiconductor device 40 of FIG. 8 is different from the semiconductor device 10 of FIG. 1 that one of contact plugs is omitted.

Referring to FIG. 8, the fourth and third dummy wirings DM4a and DM3a may be physically connected via the third dummy contact plug DC3a to form a first material movement path HP5. The first and second dummy wirings DM1a and DM2a may be electrically connected via the first dummy contact plug DC1a, and the substrate 101 and the first dummy wiring DM1a may be directly connected via the dummy direct contact DDCa to form a second material movement path HP7. The second and third dummy wirings DM2a and DM3a may not be electrically connected.

When the second and third dummy wirings DM2a and DM3a are not electrically connected, a short discontinuous section may be generated in a path from the first, second, third, and fourth dummy wirings DM1a, DM2a, DM3a, and DM4a and the substrate 101. For example, a great quantity of hydrogen may be also secured via the third dummy contact plug DC3a from the fourth dummy wiring DM4a provided on an upper portion. A third material movement path HP6 may be formed via the interlayer insulating layer 126 in the discontinuous section, and thus hydrogen may diffuse. Hydrogen diffused through the third material movement path HP6 may be transferred to the second dummy wiring DM2a again so that hydrogen may diffuse to the substrate 101 along the second material movement path HP7.

As described above, at least two pairs of adjacent dummy wirings of the first, second, third, and fourth dummy wirings DM1a, DM2a, DM3a, and DM4a may be respectively electrically connected via at least two of the first, second, and third contact plugs DC1a, DC2a, and DC3a. In example embodiments, at least one of the first, second, and third contact plugs DC1a, DC2a, and DC3a may be omitted.

Figure 9:
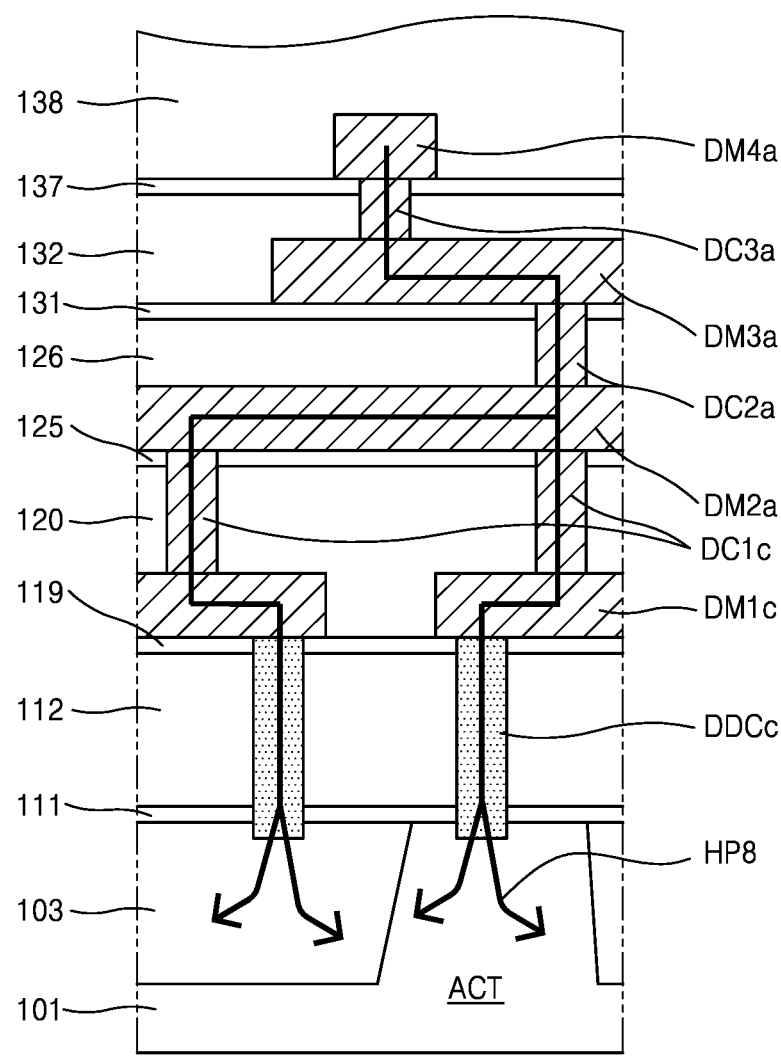

FIG. 9 is a cross-sectional view of a semiconductor device 50 according to exemplary embodiments. Although the semiconductor device 50 of FIG. 9 is similar to the semiconductor device 10 of FIG. 1, the semiconductor device 50 of FIG. 9 is different from the semiconductor device 10 of FIG. 1 that two dummy direct contacts are directly connected to the device isolation layer 103 and an active area ACT of the substrate 101, respectively.

Referring to FIG. 9, a plurality of first dummy wirings DM1c may extend by being spaced apart from each other at a first level. The one second dummy wiring DM2a may extend at a second level different from the first level. The plurality of first dummy wirings DM1c may be electrically connected to the one second dummy wiring DM2a via a plurality of first dummy contact plugs DC1c between the first and second levels. The plurality of first dummy wirings DM1c may be connected to the first substrate 101 via a plurality of dummy direct contacts DDCc.

For example, hydrogen may diffuse through a material diffusion path HP8 from the fourth dummy wiring DM4a to the substrate 101.

Figure 10:
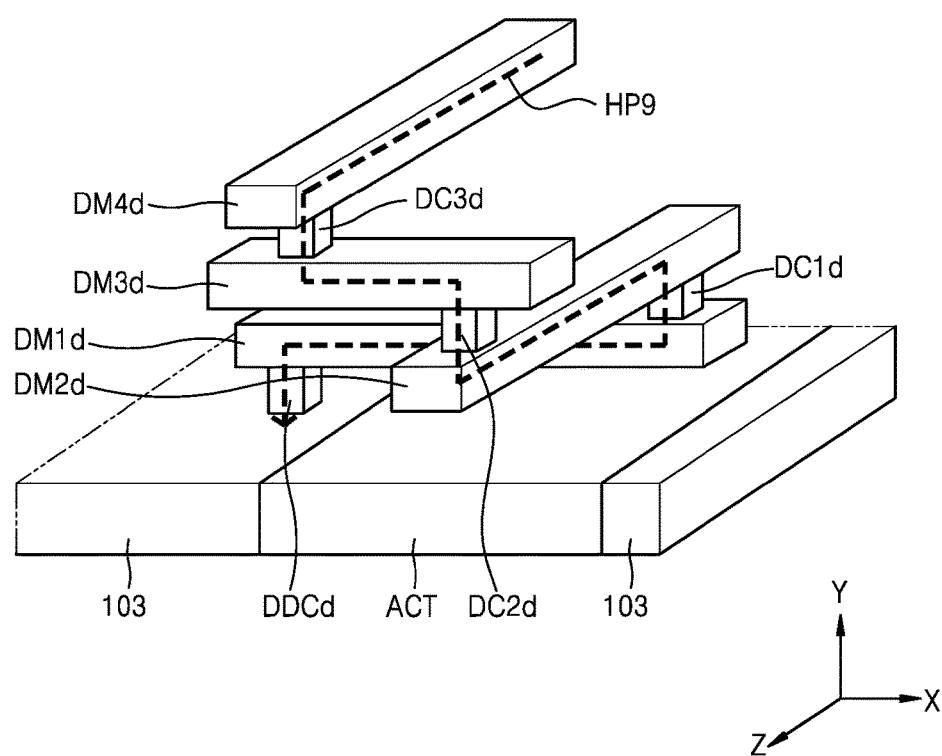
FIG. 10 is a perspective view of a semiconductor device according to exemplary embodiments.
Figure 11:
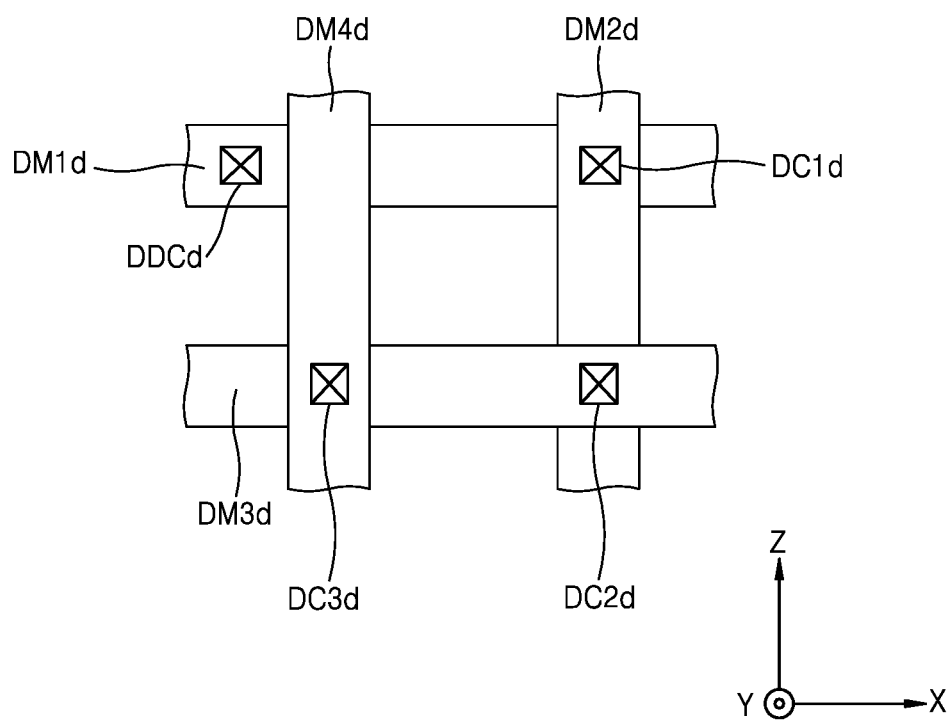
FIG. 11 is a layout of a portion of the semiconductor device of FIG. 10 according to exemplary embodiments.

FIG. 10 is a perspective view of a semiconductor device 60 according to exemplary embodiments. FIG. 11 is a layout of a portion of the semiconductor device 60 of FIG. 10 according to exemplary embodiments.

Referring to FIGS. 10 and 11, first, second, third, and fourth dummy wirings DM1d, DM2d, DM3d, and DM4d may be sequentially formed on the substrate 101 from a low level. The first dummy wiring DM1d may extend in a first direction (the X direction of FIGS. 10 and 11) at a first level closest to the substrate 101. The second dummy wiring DM2d may extend in a second direction (a Z direction of FIGS. 10 and 11) perpendicular to the first direction at a second level higher than the first level. The third dummy wiring DM3d may extend in the first direction (the X direction of FIGS. 10 and 11) at a third level higher than the second level. The fourth dummy wiring DM4d may extend in the second direction (the Z direction of FIGS. 10 and 11) at a fourth level higher than the third level.

In example embodiments, structures of the first, second, third, and fourth dummy wirings DM1d, DM2d, DM3d, and DM4d according to the inventive concept are not limited thereto. Extension directions or shapes of the first, second, third, and fourth dummy wirings DM1d, DM2d, DM3d, and DM4d may be freely selected. In some exemplary embodiments, the first, second, third, and fourth dummy wirings DM1d, DM2d, DM3d, and DM4d may extend in the same direction or at least two of the first, second, third, and fourth dummy wirings DM1d, DM2d, DM3d, and DM4d may extend in different directions.

A dummy direct contact DDCd may connect the substrate 101 and the first dummy wiring DM1d to each other. First, second, and third dummy contact plugs DC1d, DC2d, and DC3d may connect the first, second, third, and fourth dummy wirings DM1d, DM2d, DM3d, and DM4d. Accordingly, a continuous material movement path between the substrate 101 and the fourth dummy wiring DM4d may be formed. The substrate 101 may receive a great amount of hydrogen through the continuous material movement path. Hydrogen may cure a dangling bond defect on a surface of the substrate 101, thereby improving an operating speed and refresh characteristics and increasing the reliability of the semiconductor device 60.

Figure 12:
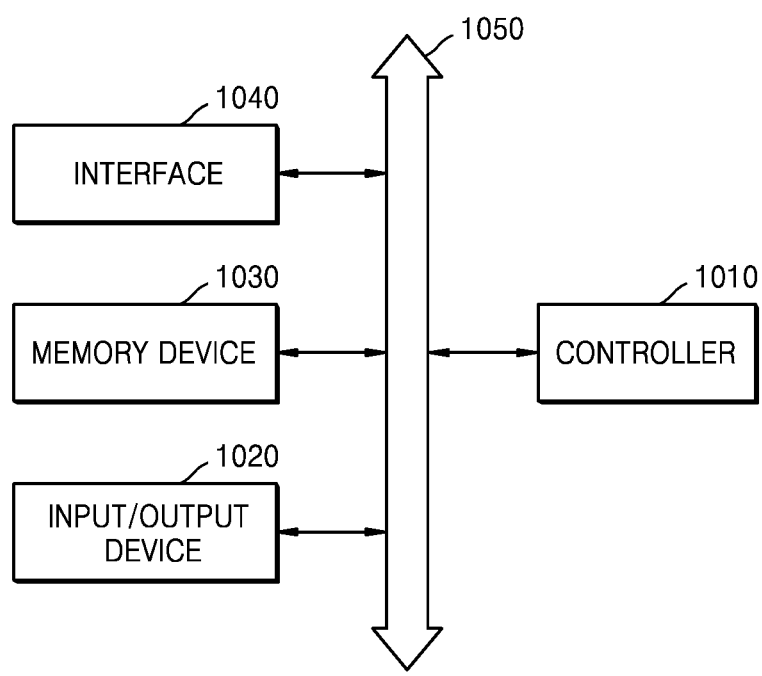
FIG. 12 illustrates a system including a semiconductor device according to certain embodiments.

FIG. 12 illustrates a system 1000 including a semiconductor device according to certain embodiments.

Referring to FIG. 12, the system 1000 includes a controller 1010, an input/output device 1020, a memory device 1030, and an interface 1040. The system 1000 may be a mobile system or a system transmitting or receiving information. In some exemplary embodiments, the mobile system may be a personal digital assistant (PDA), a portable computer, a web tablet, a wireless phone, a mobile phone, a digital music player, or a memory card.

The controller 1010 is for controlling running programs in the system 1000 and may include a microprocessor, a digital signal processor, a microcontroller, or a similar device.

The input/output device 1020 may be used for inputting or outputting data of the system 1000. The system 1000 may be connected with an external device, for example a personal computer or a network, by using the input/output device 1020, and may mutually exchange data with the external device. The input/output device 1020 may be, for example, a keypad, a keyboard, or a display device.

The memory device 1030 may store a code and/or data for an operation of the controller 1010, or may store data processed in the controller 1010. The memory device 1030 includes a semiconductor device including a fin-type field effect transistor according to the present disclosure. For example, the memory device 1030 may include at least one of the semiconductor devices 10, 20, 30, 40, 50, and 60 described with reference to FIGS. 1 through 11 above.

The interface 1040 may be a data transmission path between the system 1000 and other external devices. The controller 1010, the input/output device 1020, the memory device 1030, and the interface 1040 may communicate with one another via a bus 1050. The system 1000 may be used in mobile phones, MP3 players, navigation, portable multimedia players (PMP), solid state disk (SSD), or household appliances.

Figure 13:
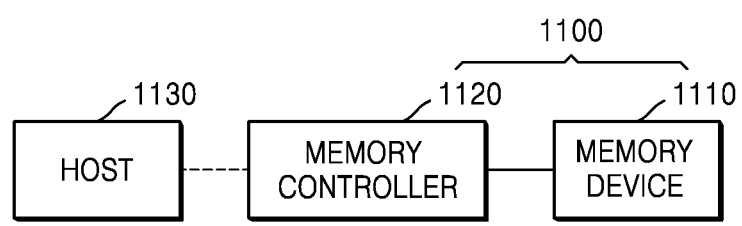
FIG. 13 is a memory card including a semiconductor device according to certain embodiments.

FIG. 13 is a memory card 1100 including a semiconductor device according to certain embodiments.

Referring to FIG. 13, the memory card 1100 includes a memory device 1110 and a memory controller 1120.

The memory device 1110 may store data. In some exemplary embodiments, the memory device 1110 may be non-volatile in which stored data may remain even when power supply is stopped. The memory device 1110 may include semiconductor devices according to the embodiments disclosed herein. For example, the memory device 1110 may include at least one of the semiconductor devices 10, 20, 30, 40, 50, and 60 described with reference to FIGS. 1 through 11 above.

The memory controller 1120 may read data stored in the memory device 1110 or store data of the memory device 1110 in response to a reading/writing request of a host 1130. The memory controller 1120 may include semiconductor devices according to the embodiments of the inventive concept. For example, the memory controller 1120 may include at least one of the semiconductor devices 10, 20, 30, 40, 50, and 60 described with reference to FIGS. 1 through 11 above.

While the present disclosure has been particularly shown and described with reference to exemplary embodiments thereof, it will be understood that various changes in form and details may be made therein without departing from the spirit and scope of the following claims.

What is claimed is:

1. A semiconductor device comprising:
    a plurality of dummy wirings formed at different vertical levels on a substrate and electrically floated, each of the plurality of dummy wirings extending in a horizontal direction parallel to a top surface of the substrate;
    a first insulating layer formed between the substrate and the plurality of dummy wirings;
    a first hole formed in the first insulating layer extending from a top surface of the first insulating layer to a bottom surface of the first insulating layer, and with respect to a top down view, the first hole having a single continuous boundary and fully occupying the area within the single continuous boundary; and
    a plurality of dummy contact plugs each electrically connected between corresponding pair of the plurality of dummy wirings, each of the plurality of dummy contact plugs extending in a vertical direction perpendicular to the top surface of the substrate, and a dummy direct contact in the first hole,
    wherein no dummy wiring of the plurality of dummy wirings is electrically connected to a terminal of any transistor included in the substrate, and
    wherein, with respect to a top down view, the dummy direct contact fills an opening and extends from a first side of the single continuous boundary of the opening, across the center of the opening and to a second side of the single continuous boundary of the opening, opposite to the first side of the opening.

2. The semiconductor device of claim 1, wherein at least two pairs of adjacent dummy wirings among the plurality of dummy wirings are respectively electrically connected via at least one of the plurality of dummy contact plugs.

3. The semiconductor device of claim 1, wherein at least first adjacent dummy wirings among the plurality of dummy wirings are electrically connected via at least two of the plurality of dummy contact plugs, and
    wherein the at least two of the plurality of dummy contact plugs are formed at the same vertical level.

4. The semiconductor device of claim 1, wherein the dummy direct contact is directly connected at least one of the plurality of dummy wirings to the substrate.

5. The semiconductor device of claim 4, wherein at least two elements among the plurality of dummy wirings and the plurality of dummy contact plugs form a continuous material movement path to allow hydrogen to diffuse through the continuous material movement path.

6. The semiconductor device of claim 4, wherein the dummy direct contact is connected to a device isolation layer formed in the substrate or an active area defined by the device isolation layer in the substrate and is electrically floated in the substrate.

7. The semiconductor device of claim 4, wherein at least one of the plurality of dummy contact plugs does not overlap with the dummy direct contact in the vertical direction.

8. The semiconductor device of claim 4, wherein the substrate comprises a cell array region and a peripheral circuit region, and
wherein the plurality of dummy contact plugs are formed in the peripheral circuit region.

9. The semiconductor device of claim 4, wherein at least two elements among the plurality of dummy wirings and the plurality of dummy contact plugs form a continuous material movement path,
wherein the continuous material movement path includes at least n vertical sections perpendicular to the top surface of the substrate and at least m horizontal sections parallel to the top surface of the substrate, and
wherein a total combined distance of the m horizontal sections is greater than or equal to a total combined distance of the n vertical sections.

10. The semiconductor device of claim 1, wherein the plurality of dummy wirings comprise a plurality of first dummy wirings being spaced apart from each other on the substrate at a first same vertical level and a second dummy wiring at a second vertical level different from the first same vertical level, and
wherein the second dummy wiring is connected to the plurality of first dummy wirings via the plurality of dummy contact plugs.

11. The semiconductor device of claim 1, wherein at least two of the plurality of dummy wirings extend in different directions in relation to each other.

12. The semiconductor device of claim 1, wherein each of the dummy contact plugs has a rod shape extending in the vertical direction, and
wherein, in a plan view, a first width of each of the dummy contact plugs in a first direction and a second width of the each of the dummy contact plugs in a second direction perpendicular to the first direction are less than or equal to a width of each of the dummy wirings in the first direction.

13. A semiconductor device comprising:
first, second, third, and fourth dummy wirings sequentially formed on a substrate from a low level, each of the first, second, third, and fourth dummy wirings extending in a horizontal direction parallel to a top surface of the substrate, and electrically floated;
a plurality of dummy contact plugs each electrically connecting adjacent dummy wirings among the first, second, third, and fourth dummy wirings, each of the plurality of dummy contact plugs extending in a vertical direction perpendicular to the top surface of the substrate; and
a dummy direct contact directly connecting at least one of the first, second, third, and fourth dummy wirings to the substrate,
wherein no dummy wiring of the first, second, third, and fourth dummy wirings is electrically connected to a terminal of any one of a plurality of transistors included in the substrate, and
wherein the dummy direct contact is directly connected to a device isolation layer formed in the substrate.

14. The semiconductor device of claim 13, wherein the plurality of dummy contact plugs comprise a first dummy contact plug connecting the first and second dummy wirings and a second dummy contact plug connecting the third and fourth dummy wirings, and
wherein the second and third dummy wirings are not connected via at least one of the plurality of dummy contact plugs.

15. The semiconductor device of claim 13, wherein the substrate and the first dummy wiring are not electrically connected.

16. A semiconductor device comprising:
a semiconductor substrate;
a plurality of dummy metal lines formed at different vertical levels from the semiconductor substrate, each of the plurality of dummy metal lines extending in a horizontal direction parallel to a top surface of the semiconductor substrate;
a plurality of insulating layers each disposed below a corresponding dummy metal line;
one or more dummy contact plugs extending in a vertical direction perpendicular to the top surface of the semiconductor substrate and electrically connecting at least two of the plurality of dummy metal lines; and
a dummy direct contact directly connecting at least one of the plurality of dummy metal lines to the semiconductor substrate,
wherein at least one of the dummy metal lines extends in a different direction from others,
wherein at least one of the dummy contact plugs does not overlap with the dummy direct contact in the vertical direction, and
wherein at least two adjacent dummy metal line are not electrically connected to each other.

17. The semiconductor device of claim 16, further comprising:
a plurality of transistors formed on the semiconductor substrate,
wherein no dummy metal line of the plurality of dummy metal lines is electrically connected to a terminal of any one of the plurality of transistors.

18. The semiconductor device of claim 16, wherein the plurality of dummy metal lines are not electrically connected to a voltage source or a ground.

19. The semiconductor device of claim 16, wherein two adjacent dummy metal lines of the plurality of dummy metal lines extend in a different direction in relation to each other.

* * * * *